United States Patent
Matsunaga

(10) Patent No.: US 9,335,642 B2
(45) Date of Patent: May 10, 2016

(54) EUV EXPOSURE APPARATUS AND CLEANING METHOD

(71) Applicant: KABUSHIKI KAISHA TOSHIBA, Tokyo (JP)

(72) Inventor: Kentaro Matsunaga, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 234 days.

(21) Appl. No.: 13/771,342

(22) Filed: Feb. 20, 2013

(65) Prior Publication Data

US 2014/0063477 A1    Mar. 6, 2014

(30) Foreign Application Priority Data

Sep. 6, 2012   (JP) .................................. 2012-196175

(51) Int. Cl.
*G03F 7/20* (2006.01)
(52) U.S. Cl.
CPC .................................. *G03F 7/70925* (2013.01)
(58) Field of Classification Search
CPC ..... G03F 7/702; G03F 7/70306; G03F 7/707; G03F 7/70925; G03F 7/70908; G03F 1/24; G03F 1/22; G02B 27/0006; B08B 7/0035; B08B 7/0057
USPC ................. 355/30, 72, 55, 67, 75; 250/504 R
See application file for complete search history.

(56) References Cited

U.S. PATENT DOCUMENTS

| | | | |
|---|---|---|---|
| 5,870,176 A * | 2/1999 | Sweatt et al. ................... | 355/53 |
| 6,268,904 B1 * | 7/2001 | Mori et al. ...................... | 355/53 |
| 6,385,290 B1 * | 5/2002 | Kondo et al. ................... | 378/84 |
| 6,980,278 B2 * | 12/2005 | Aoyama et al. ................. | 355/53 |
| 7,315,033 B1 * | 1/2008 | Pawloski ................... | A61L 2/10 |
| | | | 250/492.2 |
| 7,355,672 B2 | 4/2008 | Van Herpen et al. | |
| 7,414,700 B2 | 8/2008 | Van Herpen et al. | |
| 7,497,545 B2 | 3/2009 | Shimizu | |
| 2004/0189963 A1 * | 9/2004 | Ohsaki ........................... | 355/53 |
| 2005/0057734 A1 * | 3/2005 | Johannes Stevens et al. .. | 355/30 |
| 2007/0240735 A1 * | 10/2007 | Aoyama et al. ................. | 134/1 |
| 2008/0212045 A1 * | 9/2008 | Bader ............................. | 355/30 |
| 2008/0267815 A1 * | 10/2008 | Morishima et al. ............ | 422/24 |
| 2011/0222042 A1 * | 9/2011 | Iizuka et al. ................... | 355/71 |
| 2011/0259374 A1 | 10/2011 | Nakayama | |
| 2011/0262866 A1 | 10/2011 | Nakayama | |

FOREIGN PATENT DOCUMENTS

| | | |
|---|---|---|
| JP | 2005-244015 A | 9/2005 |
| JP | A-2006-135307 | 5/2006 |
| JP | 2006-289648 A | 10/2006 |
| JP | 2008-227083 A | 9/2008 |

(Continued)

*Primary Examiner* — Steven Whitesell Gordon
(74) *Attorney, Agent, or Firm* — Posz Law Group, PLC

(57) ABSTRACT

According to one embodiment, an EUV exposure apparatus includes a mirror which reflects an EUV light beam irradiated from a light source and a wafer stage which is irradiated with the EUV light beam reflected by the mirror. When exposure of a first wafer is to be performed, the first wafer is mounted on the wafer stage, and the wafer stage allows the first wafer to be irradiated with the EUV light beam. In addition, when cleaning of the mirror is to be performed, the EUV light beam is reflected by a reflection substrate, and the wafer stage allows the mirror to be irradiated with the reflected light beam.

6 Claims, 7 Drawing Sheets

(56) References Cited

FOREIGN PATENT DOCUMENTS

| JP | 2009-049438 A | 3/2009 |
| JP | 2011-171620 A | 9/2011 |
| JP | 2011-230053 A | 11/2011 |
| JP | 2011-243949 A | 12/2011 |
| JP | 2012-004158 A | 1/2012 |

* cited by examiner

EUV EXPOSURE APPARATUS AND CLEANING METHOD

CROSS-REFERENCE TO RELATED APPLICATIONS

This application is based upon and claims the benefit of priority from Japanese Patent Application No. 2012-196175, filed on Sep. 6, 2012; the entire contents of which are incorporated herein by reference.

FIELD

The embodiments generally relate to an EUV exposure apparatus and a cleaning method.

BACKGROUND

An EUV (Extreme Ultra-Violet) exposure apparatus is an apparatus which reduces and projects a micro-pattern formed on a reticle onto resist on a wafer by using an EUV light beam. During the performing of the EUV exposure, an organic material as a resist material is decomposed by energy of the EUV irradiation light beam, so that a portion of decomposition products called an out-gas is emitted into the EUV exposure apparatus. The emitted decomposition product is adhered on a mirror in the EUV exposure apparatus, and thus, the mirror is hazed, so that reflectance of the mirror is decreased. Therefore, illuminance of the EUV light beam irradiated on the resist film on the wafer is deteriorated. As a result, there is a problem in that an exposure rate is decreased and productivity is decreased.

As a method of removing the haze of the mirror, a gas or a radical is supplied into the exposure apparatus. However, in this method, the adhesion material cannot be efficiently removed. Therefore, a technique for efficiently removing the adhered material adhered on the mirror is preferred.

DETAILED DESCRIPTION

According to embodiments, an EUV exposure apparatus is provided. The EUV exposure apparatus is configured to include a mirror which reflects an EUV light beam irradiated from a light source and a wafer stage which is irradiated with the EUV light beam reflected by the mirror. When exposure is to be performed on a first wafer, the first wafer is mounted on the wafer stage, and the first wafer is irradiated with the EUV light beam. In addition, in the wafer stage, when cleaning is to be performed on the mirror, the EUV light beam is reflected by a reflection substrate, and the mirror is irradiated with the reflected light beam.

Hereinafter, EUV exposure apparatuses and cleaning methods according to embodiments will be described in detail with reference to the accompanying drawings. However, the present invention is not limited to the embodiments.

First Embodiment

Figure 1:
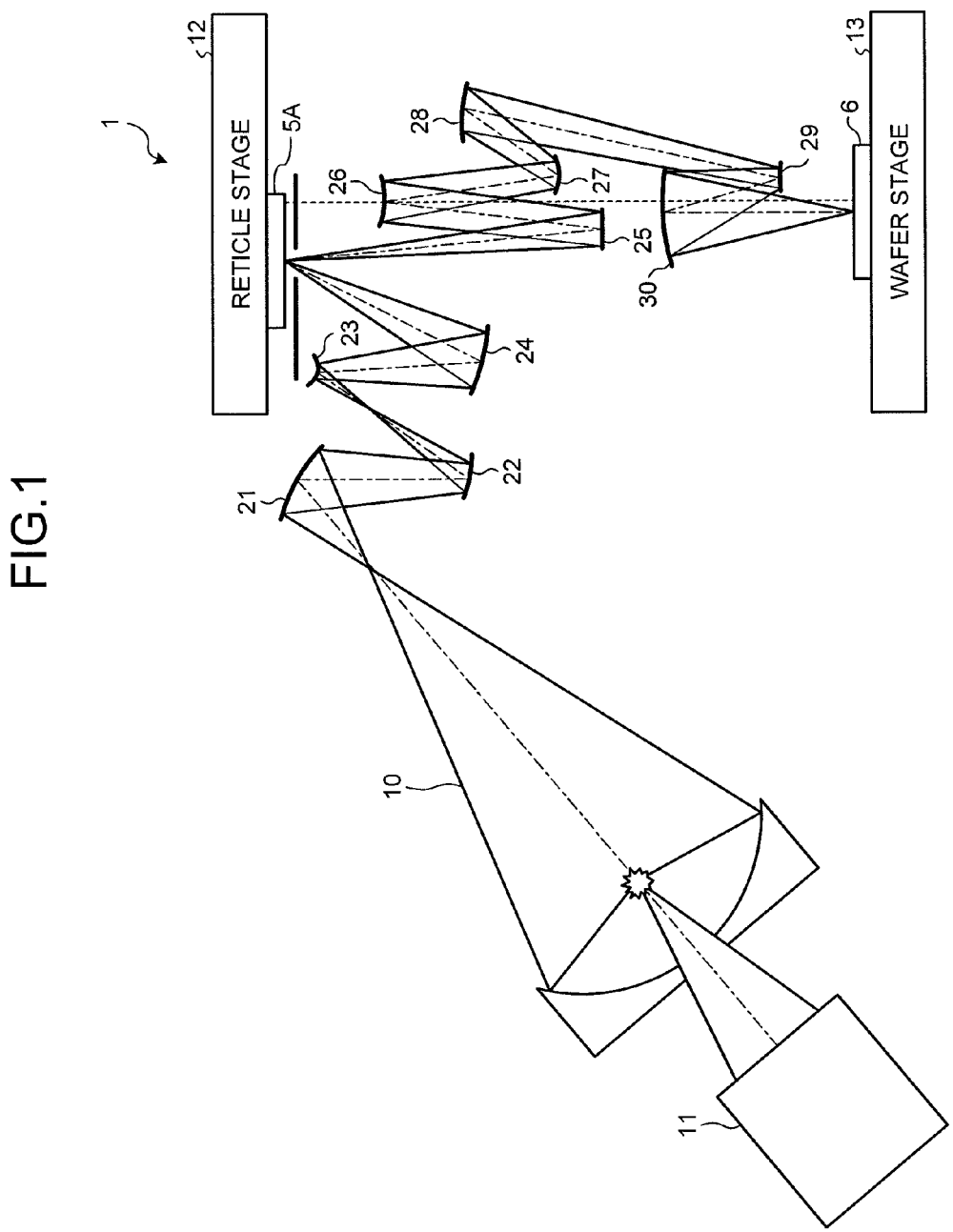
FIG. 1 is a diagram illustrating a configuration of an EUV exposure apparatus according to a first embodiment.

FIG. 1 is a diagram illustrating a configuration of an EUV exposure apparatus according to a first embodiment. The EUV (Extreme Ultra-Violet) exposure apparatus 1 is an apparatus which reflects the EUV light beam 10 with an EUV reticle (not illustrated) supported by a reticle stage 12 and reduces and projects a pattern on the reticle onto a wafer (not illustrated). The EUV exposure apparatus 1 is configured to include a light source 11, mirrors 21 to 30, a reticle stage 12, and a wafer stage 13. The EUV exposure apparatus 1 according to the embodiment reflects the EUV light beam 10 toward the mirrors 21 to 30 by using the reflection substrate 6 reflecting the EUV light beam 10, so that the mirrors 21 to 30 are cleaned.

The light source 11 outputs the EUV light beam 10 having a wavelength of $\lambda=13.5$ nm to supply the EUV light beam to a reflective reduction projection system side (mirrors 21 to 30 side). The mirrors 21 to 30 reflect the EUV light beam 10 to guide the EUV light beam 10 onto the wafer stage 13. The mirrors 21 to 30 are sequentially arranged in the order of the mirror 21, the mirror 22, the mirror 23, the mirror 24, the mirror 25, the mirror 26, the mirror 27, the mirror 28, the mirror 29, and mirror 30 in the direction from the light source 11 to the wafer stage 13.

The reticle stage 12 is disposed, for example, in an optical path between the mirror 24 and the mirror 25. The reticle stage 12 supports a reticle (EUV mask) (not illustrated). When exposure is to be performed on the wafer, the reticle stage 12 supports the EUV mask (not illustrated) where a circuit pattern and the like is formed. When cleaning is to be performed on the mirrors 21 to 30, the reticle stage 12 supports a cleaning reticle 5A. The cleaning reticle 5A has a multilayered film structure, so that the EUV light beam 10 can be reflected by a multilayered film.

When cleaning is to be performed on the mirrors 21 to 30, the cleaning reticle 5A is inserted from an external portion of the EUV exposure apparatus 1 into the EUV exposure apparatus 1. In addition, the mirrors 21 to 30 may be cleaned by using a substrate (cleaning substrate) having the same configuration as the cleaning reticle 5A. The cleaning substrate is a substrate other than quartz, for example, a Si (silicon) substrate such as a wafer. In this case, when cleaning is to be performed on the mirrors 21 to 30, the cleaning substrate is inserted from an external portion of the EUV exposure apparatus 1 into the EUV exposure apparatus 1. In addition, the cleaning substrate may be formed on the reticle stage 12.

The wafer stage 13 is arranged at a lower end side of the optical path from the mirror 30. A substrate such as a wafer is mounted on the wafer stage 13. In the EUV exposure apparatus 1, when exposure is to be performed on the wafer, the wafer is mounted on the wafer stage 13. When cleaning is to be performed on the mirrors 21 to 30, the reflection substrate 6 is mounted on the wafer stage 13.

When cleaning is to be performed on the mirrors 21 to 30, the reflection substrate 6 is inserted from an external portion of the EUV exposure apparatus 1 into the EUV exposure apparatus 1. In addition, the reflection substrate 6 may be formed on the wafer stage 13. In the case where the reflection substrate 6 is formed on the wafer stage 13, when cleaning is to be performed on the mirrors 21 to 30, the reflection substrate 6 is moved to the position which is irradiated with the EUV light beam 10 reflected by the mirror 30 on the wafer stage 13.

When exposure is to be performed on the wafer, the EUV light beam 10 output from the light source 11 is guided to the EUV mask by the mirrors 21 to 24. Next, the EUV light beam 10 is reflected by the EUV mask. The EUV light beam 10 reflected by the EUV mask is guided to the wafer by the mirrors 25 to 30. Therefore, the resist coated on the wafer is exposed, and the mask pattern (circuit pattern) of the EUV mask is transferred to the resist.

In addition, when cleaning is to be performed on the mirrors 21 to 30, the EUV light beam 10 output from the light source 11 is guided to the cleaning reticle 5A by the mirrors 21 to 24. Next, the EUV light beam 10 is reflected by the cleaning reticle 5A. The EUV light beam 10 reflected by the cleaning reticle 5A is guided to the reflection substrate 6 by the mirrors 25 to 30.

Therefore, the EUV light beam 10 is reflected by the reflection substrate 6, and the reflected EUV light beam 10 is transmitted to the mirror 30. After the EUV light beam 10 is reflected by the mirror 30, the EUV light beam 10 is sequentially reflected by the mirror 29, the mirror 28, the mirror 27, the mirror 26, and the mirror 25 to be guided to the cleaning reticle 5A. Next, the EUV light beam 10 is reflected by the cleaning reticle 5A. The EUV light beam 10 reflected by the cleaning reticle 5A is sequentially reflected by the mirror 24, the mirror 23, the mirror 22, and the mirror 21. Therefore, the mirrors 21 to 30 are irradiated with the EUV light beam 10 reflected by the reflection substrate 6 (reflected light beam), so that the mirrors 21 to 30 are cleaned.

In the EUV exposure apparatus 1, the mirror 30 is irradiated with the EUV light beam 10, so that the mirrors 21 to 29 as well as the mirror 30 are cleaned. Therefore, in the description hereinafter, the case where the mirror 30 is to be cleaned will be described.

Figure 2A:
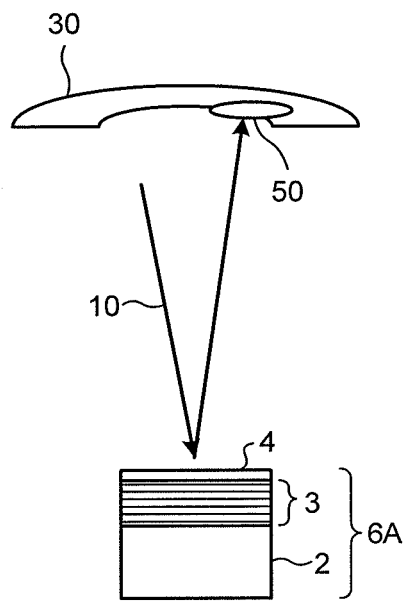
FIGS. 2A and 2B are diagrams illustrating configurations of cross sections of reflection substrates according to the first embodiment.
Figure 2B:
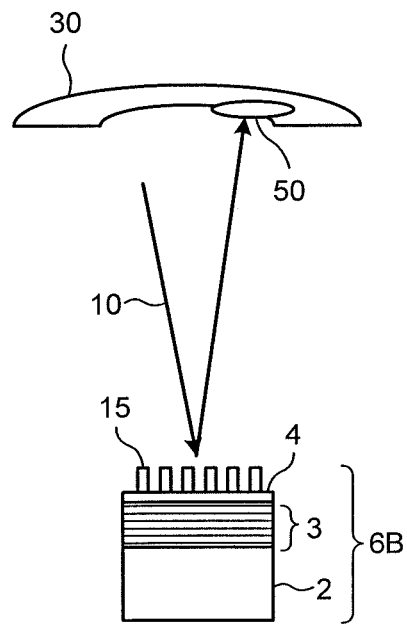

FIGS. 2A and 2B are diagrams illustrating configurations of cross sections of the reflection substrates according to the first embodiment. FIG. 2A illustrates a cross-sectional diagram of a reflection substrate 6A as an example of the reflection substrate 6, and FIG. 2B illustrates a cross-sectional diagram of a reflection substrate 6B as an example of the reflection substrate 6.

As illustrated in FIG. 2A, the reflection substrate 6A is configured to include a base substrate 2, a multilayered film 3, and a cap layer 4. The multilayered film 3 (Mo/Si multilayered film) where molybdenum layers and silicon layers are alternately formed is formed on the base substrate 2. The cap layer 4 made of ruthenium or the like is formed on the multilayered film 3.

The multilayered film 3 is formed to have various inclination angles with respect to the principal surface of the reflection substrate 6A so that the EUV light beam 10 can be reflected at various angles by respective areas (reflection areas will be described below) of the reflection substrate 6A. In other words, the multilayered film 3 is formed to have plural inclination angles with respect to the principal surface of the reflection substrate 6A so as to reflect the EUV light beam 10 at plural angles. The multilayered film 3 is preferably formed by repeating 40 or more cycles of a molybdenum layer and a silicon layer.

The mirror 30 is irradiated with the EUV light beam 10 reflected by the reflection substrate 6A. The entire surface of the mirror 30 may be irradiated with the EUV light beam 10, and otherwise, only the contaminated portions of the mirror 30 (only the adhered positions of the resist-decomposed product 50 and the like) may be irradiated with the EUV light beam 10. The reflection angle of the EUV light beam 10 on the reflection substrate 6A is different according to the inclination angle of the multilayered film 3. Therefore, the EUV light beam 10 is reflected toward the mirror 30 by the multilayered film 3 having the inclination angle according to the irradiated position of the mirror 30.

In addition, as illustrated in FIG. 2B, the reflection substrate 6B is configured to include a base substrate 2, a multilayered film 3, a cap layer 4, and a diffraction pattern (diffraction grating) 15. The multilayered film 3 is formed on the base substrate 2, and the cap layer 4 is formed on the multilayered film 3. In addition, the diffraction pattern 15 is formed on the cap layer 4.

The diffraction pattern 15 is formed to have various dimensions (pattern widths, space widths, pitches, and the like) so that the EUV light beam 10 can be reflected at various angles by respective reflection areas of the reflection substrate 6B. In other words, the diffraction pattern 15 is formed to have plural dimensions so as to reflect the EUV light beam 10 at plural angles.

The mirror 30 is irradiated with the EUV light beam 10 reflected by the reflection substrate 6B. The entire surface of the mirror 30 may be irradiated with the EUV light beam 10, and otherwise, only the contaminated portions of the mirror 30 (only the adhered positions of the resist-decomposed product 50 and the like) may be irradiated with the EUV light beam 10. The reflection angle of the EUV light beam 10 on the reflection substrate 6B is different according to the dimensions of the diffraction pattern 15. Therefore, the EUV light beam 10 is reflected toward the mirror 30 by the diffraction pattern 15 having the dimensions corresponding to the irradiated position of the mirror 30.

When exposure is to be performed on the wafer, the mirror 30 has an area (area used for the EUV exposure) which is irradiated with the EUV light beam 10. Therefore, when cleaning is to be performed on the mirrors 21 to 30, the area used for the EUV exposure may be irradiated with the EUV light beam 10.

Figure 3:
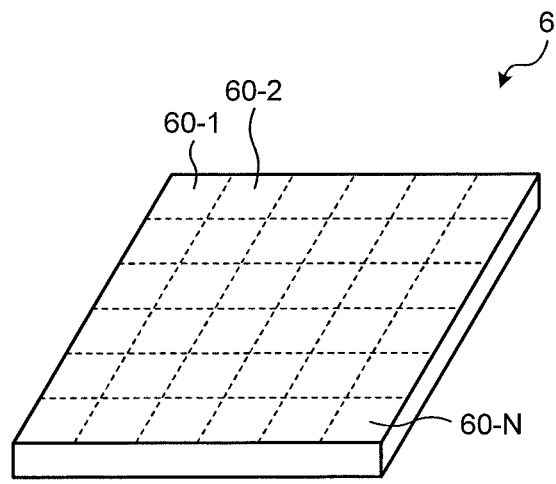
FIG. 3 is a perspective view illustrating a configuration of the reflection substrate according to the first embodiment.

FIG. 3 is a perspective view illustrating a configuration of the reflection substrate according to the first embodiment. A plurality of reflection areas 60-1 to 60-N (N is a natural number of 2 or more) is installed in the reflection substrate 6. For example, the reflection substrate 6 is partitioned into lattice-shaped areas, and the reflection areas 60-1 to 60-N are sequentially allocated to the lattice-shaped areas. The reflection films (multilayered films 3) having various inclination angles or the diffraction patterns 15 having various dimensions are formed in the respective reflection areas 60-1 to 60-N so that the EUV light beam 10 can be reflected at different angles by the reflection areas 60-1 to 60-N.

More specifically, the inclination angle of the multilayered film 3 or the dimensions of the diffraction pattern 15 is configured to be changed stepwise by the reflection areas 60-1 to 60-N so that the EUV light beam 10 can be reflected by the reflection areas 60-1 to 60-N, and thus, any position of the surface of each of the mirrors 21 to 30 can be irradiated with the reflected EUV light beam 10. In other words, the multilayered films 3 are formed to have various inclination angles so that the entire surfaces of the mirrors 21 to 30 can be irradiated, or the diffraction patterns 15 are formed to have various dimensions so that the entire surfaces of the mirrors 21 to 30 can be irradiated.

In the case where the reflection substrate 6 is the reflection substrate 6A, the multilayered films 3 having different inclination angles are disposed to the reflection areas 60-1 to 60-N. For example, multilayered films 3 of which the inclination angles are changed in a range from a first inclination angle to an N-th inclination angle are disposed to the reflection areas 60-1 to 60-N. Therefore, the EUV light beam 10 can be reflected at any one of the reflection angles in a range from a first reflection angle corresponding to the first inclination angle to an N-th reflection angle corresponding to the N-th inclination angle.

In addition, in the case where the reflection substrate 6 is the reflection substrate 6B, the diffraction patterns 15 having different dimensions are disposed to the reflection areas 60-1 to 60-N. More specifically, diffraction patterns 15 of which the pitches are changed in a range from a pitch (first pitch) which can be sufficiently resolved by the EUV exposure apparatus 1 to a pitch (N-th pitch) which is a resolution limit of the EUV exposure apparatus 1 are disposed to the reflection areas 60-1 to 60-N. Therefore, the EUV light beam 10 can be reflected at any one of the reflection angles in a range from a first reflection angle (small reflection angle) corresponding to the first pitch to an N-th reflection angle (large reflection angle) corresponding to the N-th pitch. For example, diffraction patterns 15 as line-and-space patterns which are changed in a range from a line-and-space pattern having a pitch of 700 nm to a line-and-space pattern having a pitch of 19 nm are formed in the reflection areas 60-1 to 60-N.

In addition, instead of wide line-and-space patterns having sufficient pitches, multilayered films 3 having poor surface accuracy may also be used. The multilayered films 3 having poor surface accuracy are, for example, the multilayered films 3 having various angles with respect to the principal surface of the reflection substrate 6. For example, if a large number of concave portions or convex portions are formed in the multilayered film 3, poor surface accuracy of the multilayered film 3 can be implemented.

However, if the number of laminated layers or the film thickness of multilayered film 3 is different, the phase of the EUV light beam 10 is changed, so that the reflection angle of the EUV light beam 10 is also changed. Therefore, the reflection angle of the EUV light beam 10 may be changed by changing the number of laminated layers or the film thickness of multilayered film 3. In this case, for example, the multilayered film 3 having different numbers of laminated layers or different film thickness are disposed to the reflection areas 60-1 to 60-N.

More specifically, multilayered films 3 of which the number of laminated layers or the film thickness is changed in a range from a first number of laminated layers or a first film thickness to an N-th number of laminated layers or an N-th film thickness are disposed on the reflection substrate 6. Therefore, the EUV light beam 10 can be reflected at any one of phases (N-th reflection angle) in a range from a first phase (first reflection angle) corresponding to the first number of laminated layers or the first film thickness to an N-th phase (N-th reflection angle) corresponding to the N-th number of laminated layers or the N-th film thickness.

Figure 4A:
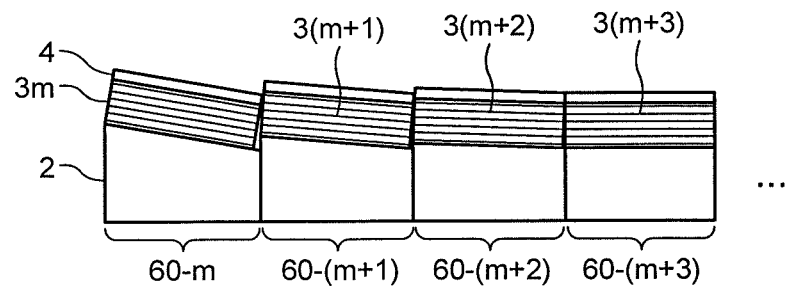
FIGS. 4A to 4C are diagrams illustrating examples of cross sections of reflection areas of reflection substrates.
Figure 4B:
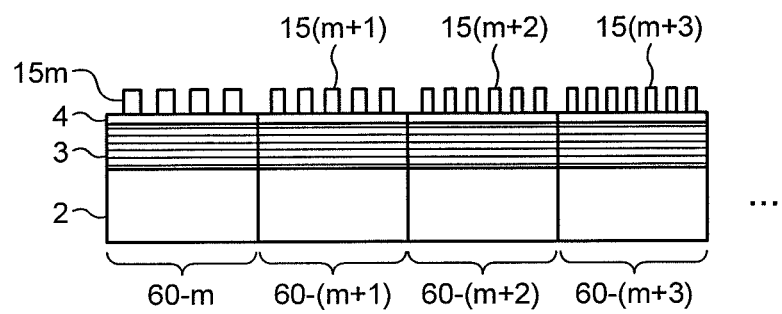
Figure 4C:
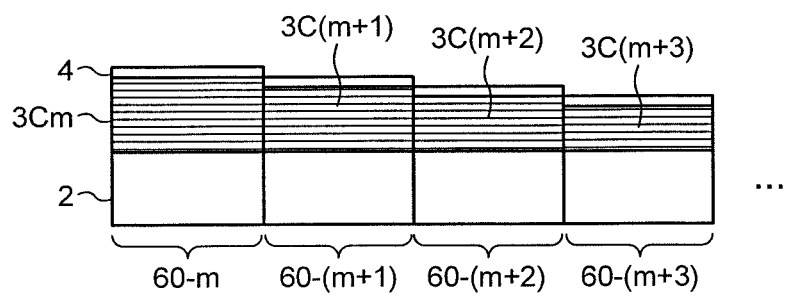

FIGS. 4A to 4C are diagrams illustrating examples of cross sections of reflection areas of reflection substrates. FIG. 4A illustrates a configuration of a cross section of a reflection substrate in the case where multilayered films having different inclination angles are disposed to reflection areas. FIG. 4B illustrates a configuration of a cross section of a reflection substrate in the case where diffraction patterns having different dimensions are disposed to reflection areas. FIG. 4C illustrates a configuration of a cross section of a reflection substrate in the case where multilayered films having different number of laminated layers or different film thickness are disposed to reflection areas.

As illustrated in FIG. 4A, in the case where multilayered films having different inclination angles are disposed to reflection areas, the multilayered film 3*m* formed to have the m-th inclination angle is disposed to the m-th (m is a natural number) reflection area 60-*m*. In addition, the multilayered films 3(*m*+1) to 3(*m*+3) formed to have the (m+1)-th to (m+3)-th inclination angles are disposed to the respective (m+1)-th to (m+3)-th reflection areas 60-(*m*+1) to 60-(*m*+3).

As illustrated in FIG. 4B, in the case where diffraction patterns having different dimensions are disposed to reflection areas, the diffraction pattern 15*m* formed to have the m-th dimensions is disposed to the m-th reflection area 60-*m*. In addition, the diffraction patterns 15(*m*+1) to 15(*m*+3) formed to have the (m+1)-th to (m+3)-th dimensions are disposed to the respective (m+1)-th to (m+3)-th reflection areas 60-(*m*+1) to 60-(*m*+3).

As illustrated in FIG. 4C, in the case where multilayered films having different number of laminated layers or different film thickness are disposed to reflection areas, the multilayered film 3Cm formed to have the m-th number of laminated layers or the m-th film thickness is disposed to the m-th reflection area 60-*m*. In addition, the multilayered films 3C(m+1) to 3C(m+3) formed to have the (m+1)-th to (m+3)-th numbers of laminated layers or the (m+1)-th to (m+3)-th film thickness are disposed to the respective (m+1)-th to (m+3)-th reflection areas 60-(*m*+1) to 60-(*m*+3).

When cleaning is to be performed on the mirrors 21 to 30, for example, the EUV light beam 10 is sequentially reflected by the reflection areas 60-1 to 60-N, so that the entire surfaces of the mirrors 21 to 30 are irradiated with the reflected EUV light beam 10. In addition, the EUV light beam 10 is reflected by any one of the reflection areas 60-1 to 60-N, so that some areas (hazed portions) of the mirrors 21 to 30 may be irradiated with the reflected EUV light beam 10.

Figure 5:
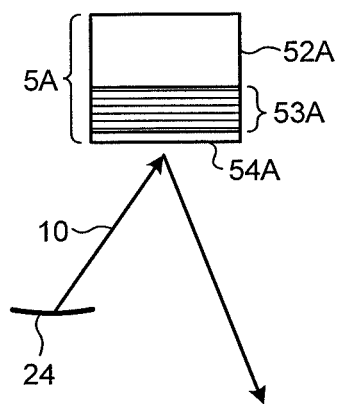
FIG. 5 is a diagram illustrating a configuration of a cross section of a cleaning reticle.

FIG. 5 is a diagram illustrating a configuration of a cross section of a cleaning reticle. The cleaning reticle 5A is configured to include a base substrate 52A, a multilayered film 53A, and a cap layer 54A. The multilayered film 53A where molybdenum layers and silicon layers are alternately formed is formed on the base substrate 52A. The cap layer 54A made of ruthenium or the like is formed on the multilayered film 53A. The multilayered film 3 is laminated in parallel to the principal surface of the cleaning reticle 5A. In the cleaning reticle 5A, a mask pattern is not formed, and the EUV light beam 10 is reflected by the entire surface of the pattern area.

The cleaning reticle 5A is irradiated with the EUV light beam 10 reflected by the mirror 24, and the EUV light beam 10 is reflected by the cleaning reticle 5A. The mirror 25 is irradiated with the EUV light beam 10 reflected by the cleaning reticle 5A.

Figure 6:
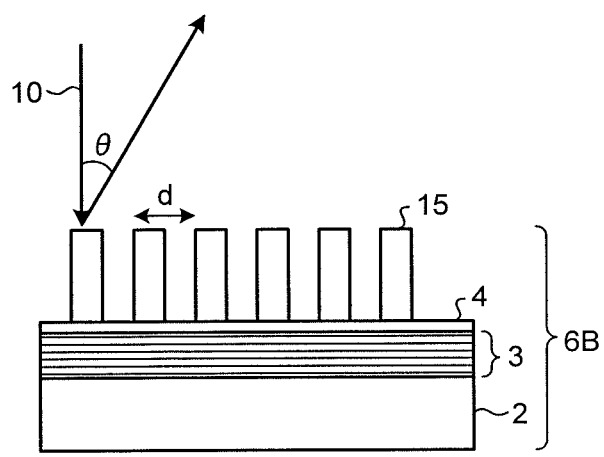
FIG. 6 is a diagram illustrating a relation between dimensions of a diffraction pattern and a reflection angle.

Next, a relation between dimensions of a diffraction pattern 15 and a reflection angle will be described. FIG. 6 is a diagram illustrating a relation between dimensions of a diffraction pattern and a reflection angle. In the case where the pitch of the diffraction pattern 15 is d, the reflection angle θ of the EUV light beam 10 on the reflection substrate 6B is expressed by the following equation (1).

$$\sin\theta = n\lambda/d (n=1,2,3,\ldots) \quad (1)$$

Figure 7:
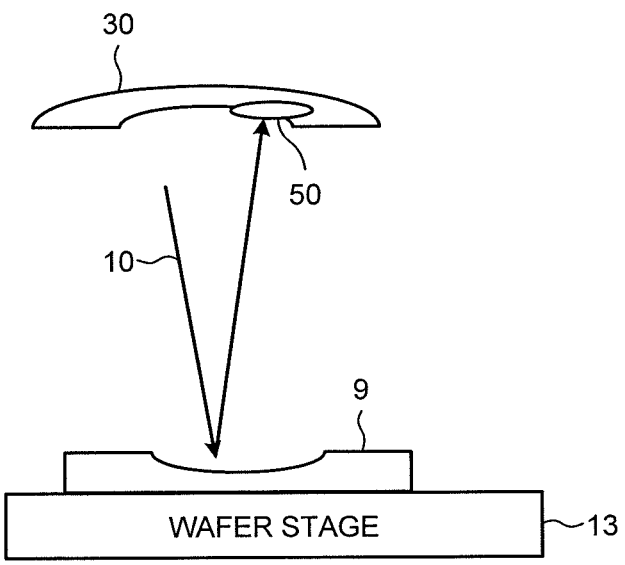
FIG. 7 is a diagram illustrating a configuration of a reflection substrate in the case where a reflected light beam of an EUV light beam is condensed in a mirror.

In addition, the reflected light beam of the EUV light beam 10 may be condensed by the mirrors 21 to 30. FIG. 7 is a diagram illustrating a configuration of the reflection substrate in the case where the reflected light beam of the EUV light beam is condensed by the mirrors 21 to 30. A reflection substrate 9 is formed by using a bowl-shaped member. An inner side (concave portion) of the bowl-shaped member is irradiated with the EUV light beam 10, so that the reflected light beam of the EUV light beam 10 is condensed by the mirrors 21 to 30. Therefore, the adhered material such as the resist-decomposed product 50 can be irradiated with a strong reflected light beam, so that it is possible to efficiently remove the resist-decomposed product 50 or the like.

The EUV exposure apparatus 1 irradiates the wafer coated with resist with the EUV light beam 10 to decompose constituents of the resist, and thus, the resist-decomposed product (out-gas) 50 is adhered to the mirrors 21 to 30 constituting a reflective projection system. In the embodiment, for example, in the case where reflectance of the mirrors 21 to 30 is lower than a regulated value, cleaning of the mirrors 21 to 30 is performed by using the reflection substrate 6 and the cleaning reticle 5A. In addition, the cleaning of the mirrors 21 to 30 may be periodically performed.

In the EUV exposure apparatus 1, when cleaning is to be performed on the mirrors 21 to 30, the intensity of the EUV light beam 10 irradiated from the light source 11 is increased up to the maximum value, and the reflection substrate 6 on the wafer stage 13 is irradiated with the EUV light beam. The EUV light beam 10 irradiated on the reflection substrate 6 is reflected by the reflection substrate 6, so that the mirrors 21 to 30 are irradiated with the reflected EUV light beam 10. Therefore, the mirrors 21 to 30 are irradiated with both of the EUV light beam 10 output from the light source 11 and the EUV light beam 10 reflected by the reflection substrate 6. As a result, the mirrors 21 to 30 can be irradiated with a light beam having a higher intensity than that of a normal light beam. Therefore, the resist-decomposed product 50 and the like adhered on the mirrors 21 to 30 are decomposed, so that resist-decomposed product 50 and the like are removed from the mirrors 21 to 30.

In other words, the resist-decomposed product 50 adhered on the mirrors 21 to 30 are removed by energy generated due to condensing of the EUV light beam 10 output from the light source 11 and EUV light beam 10 reflected by the reflection substrate 6.

During the manufacturing the semiconductor device (semiconductor integrated circuit), a film formation process, an exposure process, a development process, an etching process, and the like are repetitively performed on each layer on the wafer. More specifically, after a to-be-processed film is formed on the wafer, resist is coated on the to-be-processed film. Next, exposure is performed on the wafer coated with the resist by using a mask where a circuit pattern is formed.

The exposure process is performed, for example, by using the EUV exposure apparatus 1. When exposure is to be performed on the wafer by using the EUV exposure apparatus 1, the wafer is mounted on the wafer stage 13, and the EUV mask is set on the reticle stage 12. Next, the circuit pattern formed on the EUV mask is transferred to the wafer.

In the EUV exposure apparatus 1, the cleaning of the mirrors 21 to 30 is performed at a predetermined timing. When cleaning is to be performed on the mirrors 21 to 30, the reflection substrate 6 is mounted on the wafer stage 13, and the cleaning reticle 5A is set on the reticle stage 12. Next, the mirrors 21 to 30 are irradiated with the EUV light beam 10 reflected by the reflection substrate 6.

After the exposure process, the wafer is developed, so that the resist pattern is developed on the wafer. After that, a to-be-processed film is etched by using the resist pattern as a mask. Therefore, a pattern is formed on the to-be-processed film.

In addition, the mirrors 21 to 30 where the resist-decomposed product 50 is to be removed is allowed to be in a hydrogen, oxygen, hydrogen radical, or oxygen radical ambience, so that the removing of the resist-decomposed product 50 can be facilitated.

In addition, the reflection substrates 6A and 6B may be substrates having configurations other than the above-described configurations. In addition, the arrangement or number of the mirrors 21 to 30 is not limited to those illustrated in FIG. 1 or the like, but any number of the mirrors may be arranged at any positions.

In addition, the reflection angle of the EUV light beam 10 may be adjusted by allowing the wafer stage 13 to incline the reflection substrate 6. For example, the reflection substrate 6 is sequentially inclined at various inclination angles so that any positions of the mirrors 21 to 30 can be irradiated with the reflected EUV light beam 10. In this case, the reflection substrate 6 may be the multilayered film 3 which is parallel to the principal surface.

In this manner, according to the first embodiment, since the cleaning of the mirrors 21 to 30 is performed by using the reflection substrate 6 and the cleaning reticle 5A, the mirrors 21 to 30 can be irradiated with the EUV light beam 10 reflected by the reflection substrate 6. Therefore, it is possible to efficiently remove the adhered material (resist-decomposed product 50 or the like) adhered on the mirrors 21 to 30.

In addition, since the haze of the mirrors 21 to 30 can be removed without destruction of vacuum of the EUV exposure apparatus 1, it is possible to reduce maintenance time of the EUV exposure apparatus 1. Therefore, it is possible to improve productivity for a semiconductor device.

Second Embodiment

Next, a second embodiment will be described with reference to FIG. 8. In the second embodiment, the cleaning of the mirrors 21 to 30 is performed by using a wafer where multilayered films are formed instead of the reflection substrate 6.

Figure 8:
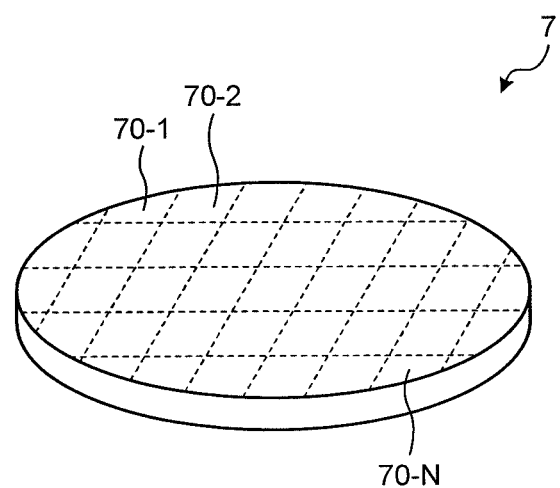
FIG. 8 is a perspective view illustrating a configuration of a reflection substrate according to a second embodiment.

FIG. 8 is a perspective view illustrating a configuration of a reflection substrate according to the second embodiment. The reflection substrate 7 according to the embodiment is configured by using a wafer and has the same configuration of cross section as that of the reflection substrate 6A or the reflection substrate 6B.

Similarly to the reflection substrate 6, a plurality of reflection areas is installed in the reflection substrate 7. More specifically, a plurality of the reflection areas 70-1 to 70-N is installed in the reflection substrate 7. For example, the reflection substrate 7 is partitioned into lattice-shaped areas, and the reflection areas 70-1 to 70-N are sequentially allocated to the lattice-shaped areas. Diffraction patterns 15 having various reflection films or various dimensions are formed in the respective reflection areas 70-1 to 70-N so that the EUV light beam 10 can be reflected at different angles by the reflection areas 70-1 to 70-N.

More specifically, the inclination angle of the multilayered film 3 or the dimension of the diffraction pattern 15 is configured to be changed stepwise by the reflection areas 70-1 to 70-N so that the EUV light beam 10 can be reflected by the reflection areas 70-1 to 70-N, and thus, any position of the surface of each of the mirrors 21 to 30 can be irradiated with the EUV light beam 10.

In the case where the reflection substrate 7 has the same configuration of cross section as that of the reflection substrate 6A, the multilayered films 3 having different inclination angles are disposed to the reflection areas 70-1 to 70-N. For example, multilayered films 3 of which the inclination angles are changed in a range from a first inclination angle to an N-th inclination angle are disposed on the reflection substrate 7. In addition, in the case where the reflection substrate 7 has the same configuration of cross section as that of the reflection substrate 6B, diffraction patterns 15 having different dimensions are disposed to the reflection areas 70-1 to 70-N. In addition, multilayered films 3 having different numbers of laminated layers or different film thickness may also be disposed to the reflection areas 70-1 to 70-N.

When cleaning is to be performed on the mirrors 21 to 30, for example, the EUV light beam 10 is sequentially reflected by the reflection areas 70-1 to 70-N, so the entire surfaces of the mirrors 21 to 30 are irradiated with the reflected EUV light beam 10. In addition, the EUV light beam 10 is reflected by any one of the reflection areas 70-1 to 70-N, so that some area (hazed portions) of the mirrors 21 to 30 may be irradiated with the reflected EUV light beam 10.

In this manner, according to the second embodiment, since the reflection substrate 7 having the same configuration of cross section as that of the reflection substrate 6A or the reflection substrate 6B is configured by using a wafer, the reflection substrate 7 can be easily transported during the cleaning of the mirrors 21 to 30. In addition, it is possible to easily manufacture the reflection substrate 7.

Third Embodiment

Next, a third embodiment will be described with reference to FIG. 9. In the third embodiment, a reflection substrate where multilayered films and the like are formed is mounted on a reticle stage 12.

Figure 9:
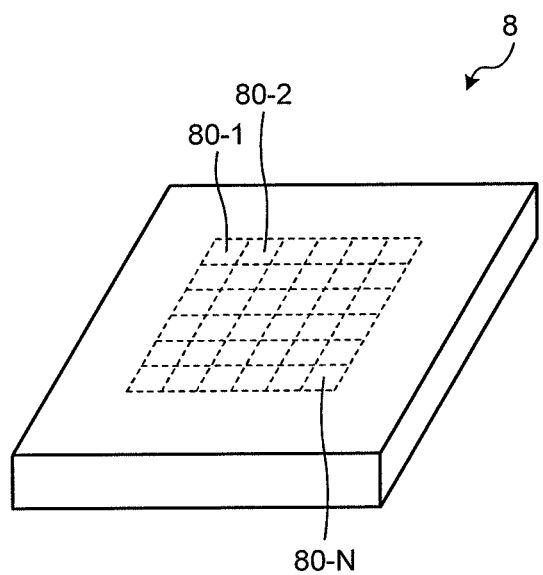
FIG. 9 is a perspective view illustrating a configuration of a reflection substrate according to a third embodiment.

FIG. 9 is a perspective view illustrating a configuration of a reflection substrate according to the third embodiment. A reflection substrate 8 according to the embodiment is configured, for example, by using a reticle or the like to have the same configuration of cross section as that of the reflection substrate 6A and the reflection substrate 6B.

Similarly to the reflection substrate 6, a plurality of reflection areas is installed in the reflection substrate 8. More specifically, a plurality of reflection areas 80-1 to 80-N is installed in the reflection substrate 8. For example, the reflection substrate 8 is partitioned into lattice-shaped areas, and the reflection areas 80-1 to 80-N are sequentially allocated to the lattice-shaped areas. Diffraction patterns 15 having various reflection films or various dimensions are formed in the respective reflection areas 80-1 to 80-N so that the EUV light beam 10 can be reflected at different angles by the reflection areas 80-1 to 80-N.

More specifically, the inclination angle of the multilayered film 3 or the dimensions of the diffraction pattern 15 is configured to be changed stepwise by the reflection areas 80-1 to 80-N so that the EUV light beam 10 can be reflected by the reflection areas 80-1 to 80-N, and thus, any position of the surface of each of the mirrors 25 to 30 can be irradiated with the EUV light beam 10.

In the case where the reflection substrate 8 has the same configuration of cross section as that of the reflection substrate 6A, the multilayered films 3 having different inclination angles are disposed to the reflection areas 80-1 to 80-N. For example, multilayered films 3 of which the inclination angles are changed in a range from a first inclination angle to an N-th inclination angle are disposed on the reflection substrate 8. In addition, in the case where the reflection substrate 8 has the same configuration of cross section as that of the reflection substrate 6B, diffraction patterns 15 having different dimensions are disposed to the reflection areas 80-1 to 80-N. In addition, multilayered films 3 having different numbers of laminated layers or different film thickness may also be disposed to the reflection areas 80-1 to 80-N.

When cleaning is to be performed on the mirrors 25 to 30, the reflection substrate 8 is inserted from an external portion of the EUV exposure apparatus 1 into the EUV exposure apparatus 1. In addition, the reflection substrate 8 may be formed on the reticle stage 12.

When cleaning is to be performed on the mirrors 25 to 30, for example, the EUV light beam 10 is sequentially reflected by the reflection areas 80-1 to 80-N, so that the entire surfaces of the mirrors 25 to 30 are irradiated with the reflected EUV light beam 10. In addition, the EUV light beam 10 is reflected by any one of the reflection areas 80-1 to 80-N, so that some area (hazed portions) of the mirrors 25 to 30 may be irradiated with the reflected EUV light beam 10.

In addition, the reflection angel of the EUV light beam 10 may be adjusted by allowing the reticle stage 12 to incline the reflection substrate 8. For example, the reflection substrate 8 is sequentially inclined at various inclination angles so that any positions of the mirrors 25 to 30 can be irradiated with the reflected EUV light beam 10. In this case, the reflection substrate 8 may be the multilayered film 3 which is parallel to the principal surface.

In this manner, according to the third embodiment, since the reflection substrate 8 having the same configuration of cross section as that of the reflection substrate 6A or the reflection substrate 6B is configured by using a reticle, the reflection substrate 8 can be easily transported during the cleaning of the mirrors 25 to 30. In addition, it is possible to easily manufacture the reflection substrate 8.

In addition, the first to third embodiments may be combined. For example, when the cleaning of the mirrors 21 to 30 is to be performed, the reflection substrate 6 or the reflection substrate 7 may be mounted on the wafer stage 13, and the reflection substrate 8 may be set on the reticle stage 12. Therefore, the mirror 30 and the like are irradiated with the reflected light beam from the reflection substrate 6 or reflection substrate 7 and the reflected light beam from the reflection substrate 8, so that it is possible to efficiently remove the adhered material (resist-decomposed product 50 or the like) adhered on the mirror 30 and the like.

In this manner, according to the first to third embodiments, it is possible to efficiently remove adhered materials adhered on mirrors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An EUV exposure apparatus comprising:
   a mirror which reflects an EUV light beam irradiated from a light source; and
   a wafer stage which is irradiated with the EUV light beam reflected by the mirror, wherein, when exposure of a first wafer is to be performed, the first wafer is mounted on the wafer stage, and the wafer stage allows the first wafer to be irradiated with the EUV light beam, and wherein, when cleaning of the mirror is to be performed, the EUV light beam is reflected by a reflection substrate that is formed on the wafer stage, and the wafer stage is movable to a position where the reflection substrate formed on the wafer stage is irradiated with the EUV light beam, and the mirror is irradiated with the reflected EUV light beam from the reflection substrate, and wherein the reflection substrate includes:

a multilayered film which reflects the EUV light beam; and a diffraction pattern which is disposed in an upper layer from the multilayered film to diffract the EUV light beam, and the diffraction pattern is formed to have plural pattern widths so that the EUV light beam is reflected at plural angles.

2. The EUV exposure apparatus according to claim 1, wherein the diffraction pattern is formed to have plural pattern widths so that an entire surface of the mirror is irradiated with the reflected light beam of the EUV light beam.

3. An EUV exposure apparatus comprising:

a mirror which reflects an EUV light beam irradiated from a light source; and a wafer stage which is irradiated with the EUV light beam reflected by the mirror, wherein, when exposure of a first wafer is to be performed, the first wafer is mounted on the wafer stage, and the wafer stage allows the first wafer to be irradiated with the EUV light beam, and wherein, when cleaning of the mirror is to be performed, the EUV light beam is reflected by a reflection substrate that is formed on the wafer stage, and the wafer stage is movable to a position where the reflection substrate formed on the wafer stage is irradiated with the EUV light beam, and the mirror is irradiated with the reflected EUV light beam from the reflection substrate, and wherein the reflection substrate includes a multilayered film which reflects the EUV light beam, and the multilayered film is formed to have plural inclination angles with respect to a principal surface of the reflection substrate so that the EUV light beam is reflected at plural angles.

4. The EUV exposure apparatus according to claim 3, wherein the multilayered film is formed to have the plural inclination angles so that an entire surface of the mirror is irradiated with the reflected light beam of the EUV light beam.

5. An EUV exposure apparatus comprising:

a mirror which reflects an EUV light beam irradiated from a light source; and a wafer stage which is irradiated with the EUV light beam reflected by the mirror, wherein, when exposure of a first wafer is to be performed, the first wafer is mounted on the wafer stage, and the wafer stage allows the first wafer to be irradiated with the EUV light beam, wherein, when cleaning of the mirror is to be performed, the EUV light beam is reflected by a reflection substrate that is formed on the wafer stage, and the wafer stage is movable to a position where the reflection substrate formed on the wafer stage is irradiated with the EUV light beam, and the mirror is irradiated with the reflected EUV light beam from the reflection substrate, wherein the reflection substrate includes a multilayered film which reflects the EUV light beam, and wherein the multilayered film is formed of plural reflection areas, the plural reflection areas having different film thicknesses, and the multilayered film reflects the EUV light beam at plural angles.

6. The EUV exposure apparatus according to claim 5, wherein the plural reflection areas of the multilayered film are configured to irradiate up to an entire surface of the mirror.

* * * * *